United States Patent
Cheng et al.

(10) Patent No.: US 12,191,215 B2
(45) Date of Patent: Jan. 7, 2025

(54) MANUFACTURING AND MEASURING SYSTEM FOR SEMICONDUCTOR STRUCTURES

(71) Applicant: NANYA TECHNOLOGY CORPORATION, New Taipei (TW)

(72) Inventors: Cheng-Ta Cheng, Taoyuan (TW); Tsu-Wen Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 684 days.

(21) Appl. No.: 17/508,961

(22) Filed: Oct. 22, 2021

(65) Prior Publication Data

US 2023/0128335 A1  Apr. 27, 2023

(51) Int. Cl.
*H01L 21/66* (2006.01)
*H01L 21/67* (2006.01)

(52) U.S. Cl.
CPC ........ *H01L 22/20* (2013.01); *H01L 21/67271* (2013.01)

(58) Field of Classification Search
None
See application file for complete search history.

(56) References Cited

U.S. PATENT DOCUMENTS

| | | | | |
|---|---|---|---|---|
| 9,841,370 | B2* | 12/2017 | Amir | G01N 21/01 |
| 10,475,712 | B2* | 11/2019 | Levy | G01B 9/02021 |
| 11,164,768 | B2* | 11/2021 | Vukkadala | G01N 21/45 |
| 11,393,731 | B2* | 7/2022 | Yang | H01L 29/41775 |
| 11,454,949 | B2* | 9/2022 | Agarwal | G05B 19/4097 |
| 11,462,546 | B2* | 10/2022 | Varghese | H10B 12/053 |
| 2016/0148850 | A1 | 5/2016 | David | |
| 2019/0079411 | A1 | 3/2019 | Cekli et al. | |
| 2019/0097056 | A1* | 3/2019 | Kuo | H01L 29/0649 |
| 2019/0139964 | A1* | 5/2019 | Varghese | H01L 21/31116 |
| 2019/0277777 | A1* | 9/2019 | Liu | G01N 21/956 |
| 2019/0302734 | A1* | 10/2019 | Agarwal | G05B 19/4097 |
| 2020/0203355 | A1 | 6/2020 | Wu et al. | |

(Continued)

FOREIGN PATENT DOCUMENTS

| | | |
|---|---|---|
| EP | 3817050 A2 | 5/2021 |
| TW | 201916122 A | 4/2019 |

(Continued)

OTHER PUBLICATIONS

Office Action dated on Feb. 2, 2024 related to U.S. Appl. No. 17/510,786.

(Continued)

*Primary Examiner* — Jethro M. Pence
(74) *Attorney, Agent, or Firm* — Xuan Zhang

(57) ABSTRACT

The present disclosure relates to a manufacturing and measuring system for semiconductor structures on a wafer. The system includes a process chamber and a measuring device. The process chamber is configured to perform operations of forming a first fin array in a bank of a die of a wafer and forming a second fin array on the first fin array. The measuring device is configured to perform a pattern wafer geometer (PWG) measuring on the wafer to obtain a displacement between a first fin of the first fin array and a first fin of the second fin array, and further configured to determine a status of wafer according to the displacement.

13 Claims, 21 Drawing Sheets

(56) References Cited

U.S. PATENT DOCUMENTS

| | | | |
|---|---|---|---|
| 2020/0287047 A1* | 9/2020 | Kuo | H01L 29/66803 |
| 2022/0005714 A1* | 1/2022 | Vukkadala | G01B 11/0675 |
| 2022/0084897 A1* | 3/2022 | Yang | H01L 29/41775 |
| 2022/0120559 A1* | 4/2022 | Zeng | G01B 11/06 |
| 2023/0089130 A1* | 3/2023 | Kuo | H01L 29/66795 |
| | | | 257/327 |
| 2023/0125695 A1* | 4/2023 | Cheng | H01L 22/34 |
| | | | 438/14 |

FOREIGN PATENT DOCUMENTS

| | | |
|---|---|---|
| TW | 202139192 A | 10/2021 |
| WO | WO2019048987 A1 | 3/2019 |

OTHER PUBLICATIONS

Summary translation of the Notice of Allowance dated Jan. 7, 2023 related to Taiwanese Application No. 111110899.
Office Action and the search report dated on Jun. 11, 2024 related to U.S. Appl. No. 17/510,786.

\* cited by examiner

MANUFACTURING AND MEASURING SYSTEM FOR SEMICONDUCTOR STRUCTURES

TECHNICAL FIELD

The present disclosure relates to a manufacturing and measuring system for semiconductor structures, and more particularly, to a manufacturing and measuring system for semiconductor structures on a wafer.

DISCUSSION OF THE BACKGROUND

According to the Moore's Law, the density of elements in the semiconductor structure is dramatically increased, and the dimension of the elements shrink fast. Consequently, the alignment issue raised by the shrunk elements becomes more and more critical. In conventional approaches, the alignment is examined off line. Moreover, the accuracy of the conventional measurement cannot be adapted to the dimension of the shrunk elements. Therefore, when the elements are fabricated at positions which are deviated from the predetermined positions, the wafer may not function correctly, and the above situation can only be known after the manufacturing is done. Hence, when the wafer has elements misaligned which causes the wafer cannot be make as a product, the manufacturing resource and time cost of the said wafer are waste. Furthermore, the throughput of the wafers is decreased.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for manufacturing and measuring a plurality of semiconductor structures. The method includes the following operations: receiving a wafer having a plurality of dies; respectively forming the plurality of semiconductor structures in a plurality of banks in each of the plurality of dies, wherein each of the semiconductor structure includes a first fin array and a second fin array disposed above the first fin array; performing a patterned wafer geometry (PWG) measurement on the wafer to obtain a displacement between a first fin of the first fin array and a first fin of the second fin array; and according to the displacement, determining a status of the wafer.

In some embodiments, the operation of respectively forming the plurality of semiconductor structures in the plurality of banks in each of the plurality of dies includes: forming the first fin array in each of the plurality of banks; and forming the second fin array on the first fin array.

In some embodiments, both of the first array and the second fin array have N fins, wherein N is a positive integer. The first fin of the first fin array corresponds to the first in of the second fin array. The displacement between the first fin of the first fin array and the first fin of the second fin array is defined from a top view of the semiconductor structure.

In some embodiments, the operation of forming the first fin array in each of the plurality of banks includes: forming a first layer; etching the first layer to form the first fin array; and planarizing the first layer to expose a top surface of the first fin array.

In some embodiments, the operation of forming the second fin array on the first fin array includes: forming a second layer on the first fin array; etching the second layer to form the second fin array; and planarizing the second layer to expose a top surface of the second fin array.

In some embodiments, the operation of performing the PWG measurement to obtain the displacement between the first fin of the first fin array and the first fin of the second fin array includes: obtaining a first overlap ratio of the first fin of the first fin array and the first fin of the second fin array; obtaining a second overlap ratio of an Nth fin of the first fin array and an Nth fin of the second fin array; obtaining a center overlap ratio of an Ath fin of the first fin array and an Ath fin of the second fin array; and obtaining the displace according the first overlap ratio, the second overlap ratio, and the center overlap ratio. When N is an odd number, A is equal to (N+1)/2. When N is an even number, A is equal to N/2.

In some embodiments, the operation of obtaining the displace according the first overlap ratio, the second overlap ratio, and the center overlap ratio includes: subtracting the first overlap ratio from the center overlap ratio to obtain a first magnification; subtracting the second overlap ratio from the center overlap ratio to obtain a second magnification; and obtaining the displacement according the first magnification and the second magnification.

In some embodiments, the first magnification is substantially equal to the second magnification.

In some embodiments, the operation of obtaining the displacement according the first magnification and the second magnification includes: obtaining an average magnification by averaging the first magnification and the second magnification; and obtaining the displacement in a lookup table, wherein the lookup table is configured to store a correspondence of the displacement and the average magnification.

In some embodiments, when the displacement is greater than a threshold value, the status of the wafer is determined as a fail status. When the displacement is not greater than the threshold value, the status of the wafer is determined as a pass status. In some embodiments, the threshold value is about 1.5 nm.

In some embodiments, the method further includes: when the status of the wafer is the fail status, removing the wafer from a batch of wafers; and when the status of the wafer is the pass status, remaining the wafer in the batch of wafers.

In some embodiments, wherein the threshold value is about 1.5 nm.

Another aspect of the present disclosure provides a system for manufacturing and measuring. The system includes a process chamber and a measuring device. The process chamber is configured to: forming a first fin array in a bank of a die of a wafer; and forming a second fin array on the first fin array. The measuring device is configured to perform a pattern wafer geometer (PWG) measuring on the wafer to obtain a displacement between a first fin of the first fin array and a first fin of the second fin array, and further configured to determine a status of wafer according to the displacement.

In some embodiments, the displacement is defined from a top view of the wafer.

In some embodiments, both of the first fin array and the second fin array have N fins, wherein N is a positive integer. The measuring device is further configured to: measure a first overlap ratio of the first fin of the first fin array and the first fin of the second fin array, measure a second overlap ratio of a Nth fin of the first fin array and a Nth fin of the second fin array, and measure a center overlap ratio of an Ath fin of the first fin array and an Ath fin of the second fin array. When is an odd number, A is equal to (N+1)/2. When N is an even number, A is equal to N/2.

In some embodiments, the measuring device is further configured to: obtain a first magnification by subtracting the first overlap ratio from the center overlap ratio, obtain a second magnification by subtracting the second overlap ratio from the center overlap ratio, and obtain the displacement according the first magnification and the second magnification.

In some embodiments, the measuring device is further configured to obtain an average magnification by averaging the first magnification and the second magnification. The measuring device includes a lookup table configured to store a correspondence of the displacement and the average magnification. The measuring device is further configured to obtain the displacement according the lookup table.

In some embodiments, when the displacement is greater than a threshold value, the status of the wafer is determined as a fail status. When the displacement is not greater than the threshold value, the status of the wafer is determined as a pass status.

In some embodiments, when the status of the wafer is the fail status, the process chamber is configured to remove the wafer from a batch of wafers.

In some embodiments, when the status of the wafer is the pass status, the process chamber is configured to remain the wafer in a batch of wafers.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
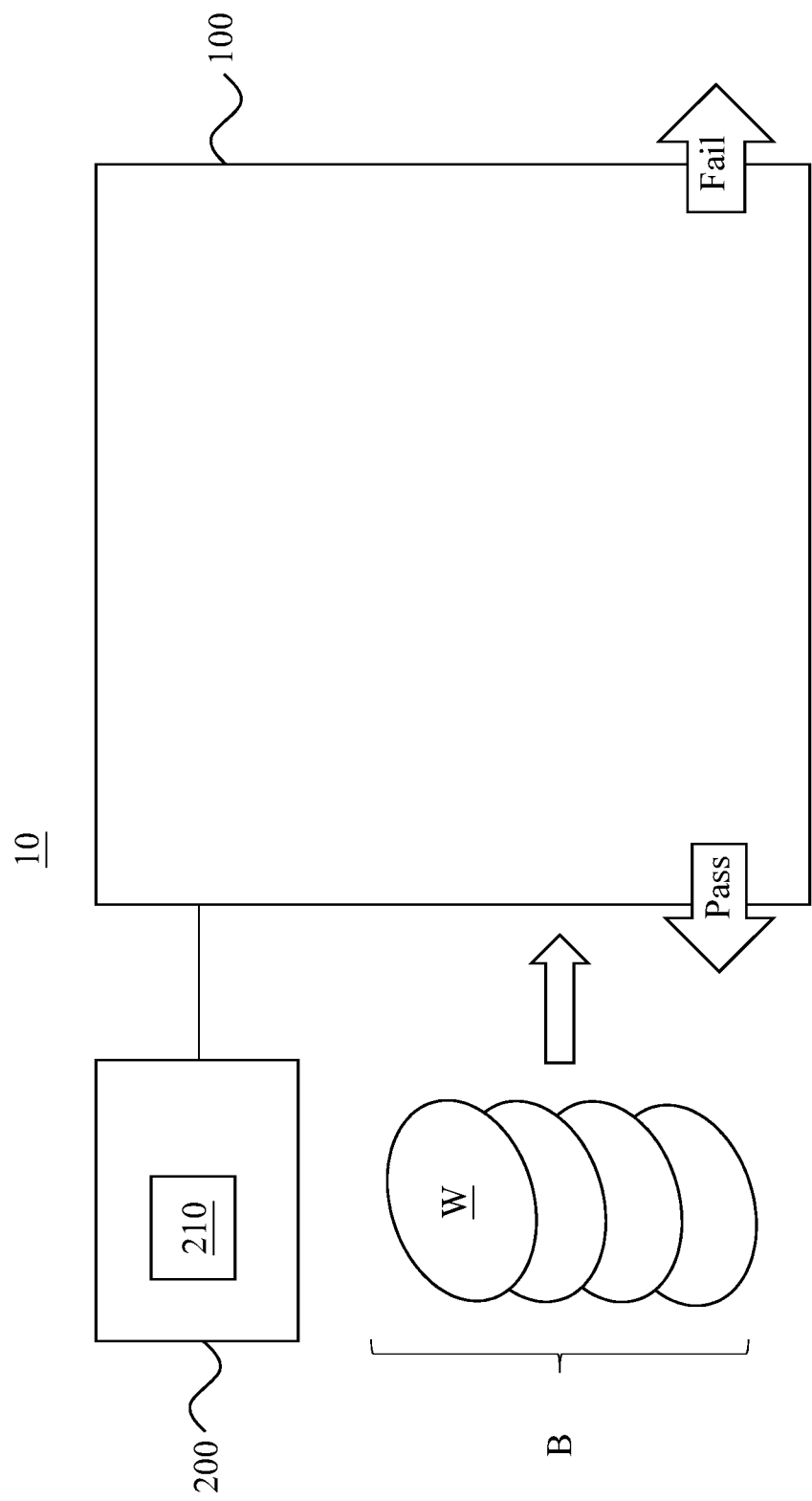
FIG. 1 is a schematic view of a manufacturing system according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic view of a manufacturing system 10 according to some embodiments of the present disclosure. The manufacturing system 10 is configured to process a batch of wafers B, and further verify each wafer W in the batch of the wafers B to determine a status of each of wafer W. For example, the manufacturing system 10 performs semiconductor processes on the batch of wafers B, and measures a physical feature (such as a dimension of a certain structure) on each of wafer W to determine the status of the wafer W according to the measuring result.

The manufacturing system 10 includes a process chamber 100 and a measuring device 200 coupled to the process chamber 100. The process chamber 100 is configured to perform semiconductor processes on the wafer W to form a semiconductor structure SS on each of the wafer W. The measuring device 200 is configured to perform a measurement on each of the wafer W to determine the status of the wafer W.

In some embodiments, the process chamber 100 fabricates fin arrays in two layers on the wafer W. The measuring device 200 measure an overlap ratio between the fin arrays in two layers in a top view of the wafer W to generate a magnification indicating the displacement between the fin arrays in two layers.

In some embodiments, the measurement performed by the measuring device 200 is a patterned wafer geometry (PWG) measurement. In some embodiment, the measuring device 200 includes a memory storing a lookup table 210. The lookup table 210 stores a correspondence of the magnification and the displacement. In some embodiments, each correspondence stored in the lookup table 210 records a displacement and a magnification. For example, the measuring device 200 searches the correspondence which includes the generated magnification, then the measuring device 200 is able to know the displacement associated with the magnification according to the correspondence in the lookup table 210. Therefore, when the measuring device 200 obtains the magnification according to the overlap ratio, the displacement can be obtained according to the lookup table 210.

In some embodiments, the manufacturing system 10 determines the following process of the wafer W according the status of the wafer W. For example, the wafer W may be determined to be removed from the batch of the wafers B, or may be determined to be processed by the next process.

Figure 2:
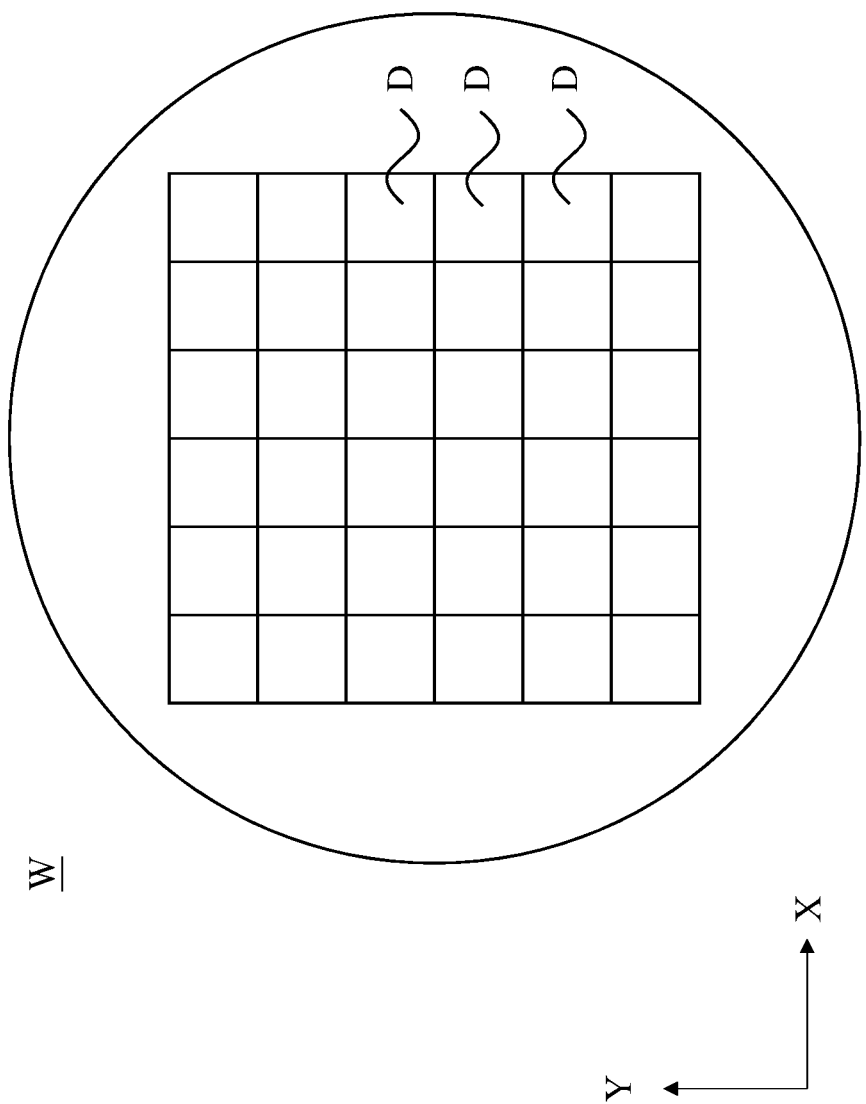
FIG. 2 is a schematic view of the wafer according to some embodiments of the present disclosure.

Reference is made to FIG. 2. FIG. 2 is a schematic view of the wafer W according to some embodiments of the present disclosure. In some embodiments, the batch of wafers B includes more than one wafer W, and each wafer W are experienced the same semiconductor processes and the same measurement.

In FIG. 2, the wafer W is illustrated from a top view of the wafer W. An X-axis and a Y-axis are illustrated to indicate the orientation of the wafer W to facilitate understanding. In some embodiments, the wafer W is a semiconductor wafer, for example, a silicon wafer. The wafer W includes a plurality of dies D. In some embodiments, those dies D are the same. The number and the position of the dies D in the wafer W shown in FIG. 2 are provided for illustrated purposes. Various numbers and the positions of the dies D in the wafer W are within the contemplated scope of the present disclosure. For example, the wafer W may have other dies D disposed around the edge of the wafer W.

Figure 3:
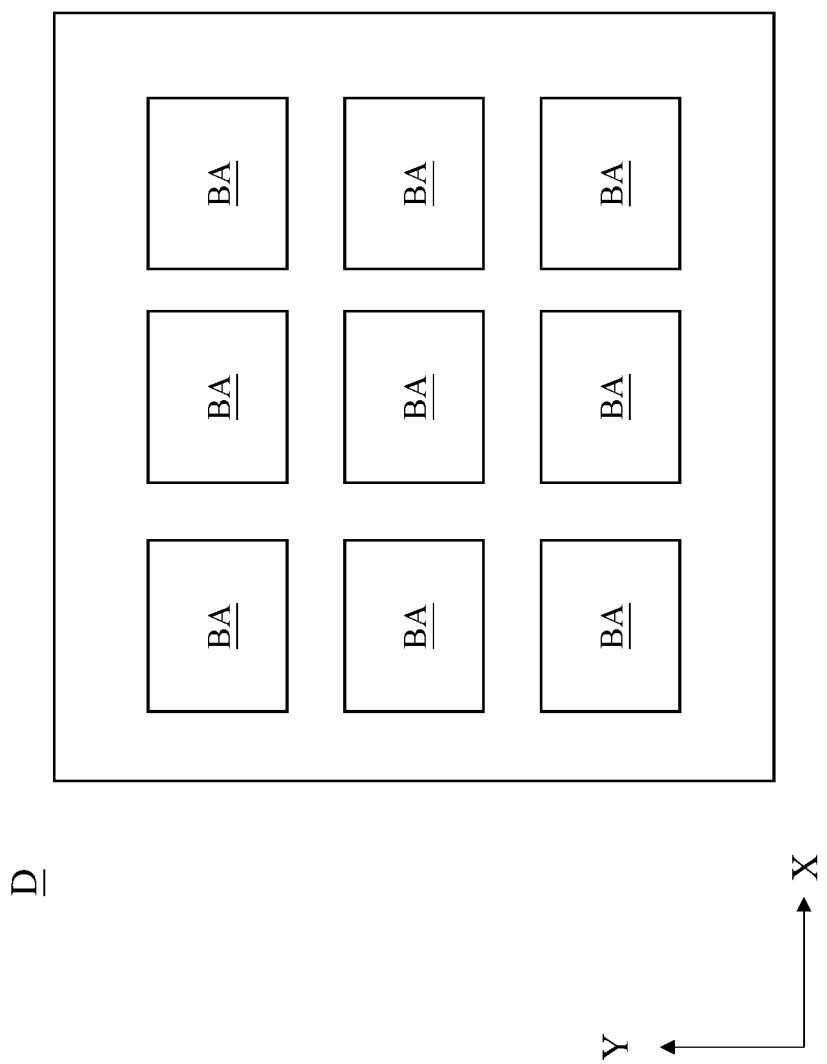
FIG. 3 is a block diagram of the die according to some embodiments of the present disclosure.

Reference is made to FIG. 3. FIG. 3 is a schematic view of the die D according to some embodiments of the present disclosure. The die D is divided into a plurality of banks BA. In some embodiments, those banks BA have the same semiconductor structures SS after the process chamber 100 performed the semiconductor processes. In FIG. 3, there are 9 banks BA shown in the die D, however, the present disclosure is not limited hereto.

In some embodiments, the semiconductor structure SS on die D includes a plurality of fins which are arranged as fin arrays. In some embodiment, the edges of the banks BA are defined by the fin array in the semiconductor structure SS. In other words, the fins on the die D are grouped to several arrays, and each array represents a bank BA in the die D. Alternatively stated, each bank BA has a fin array separated from a fin array in other banks BA.

Figure 4:
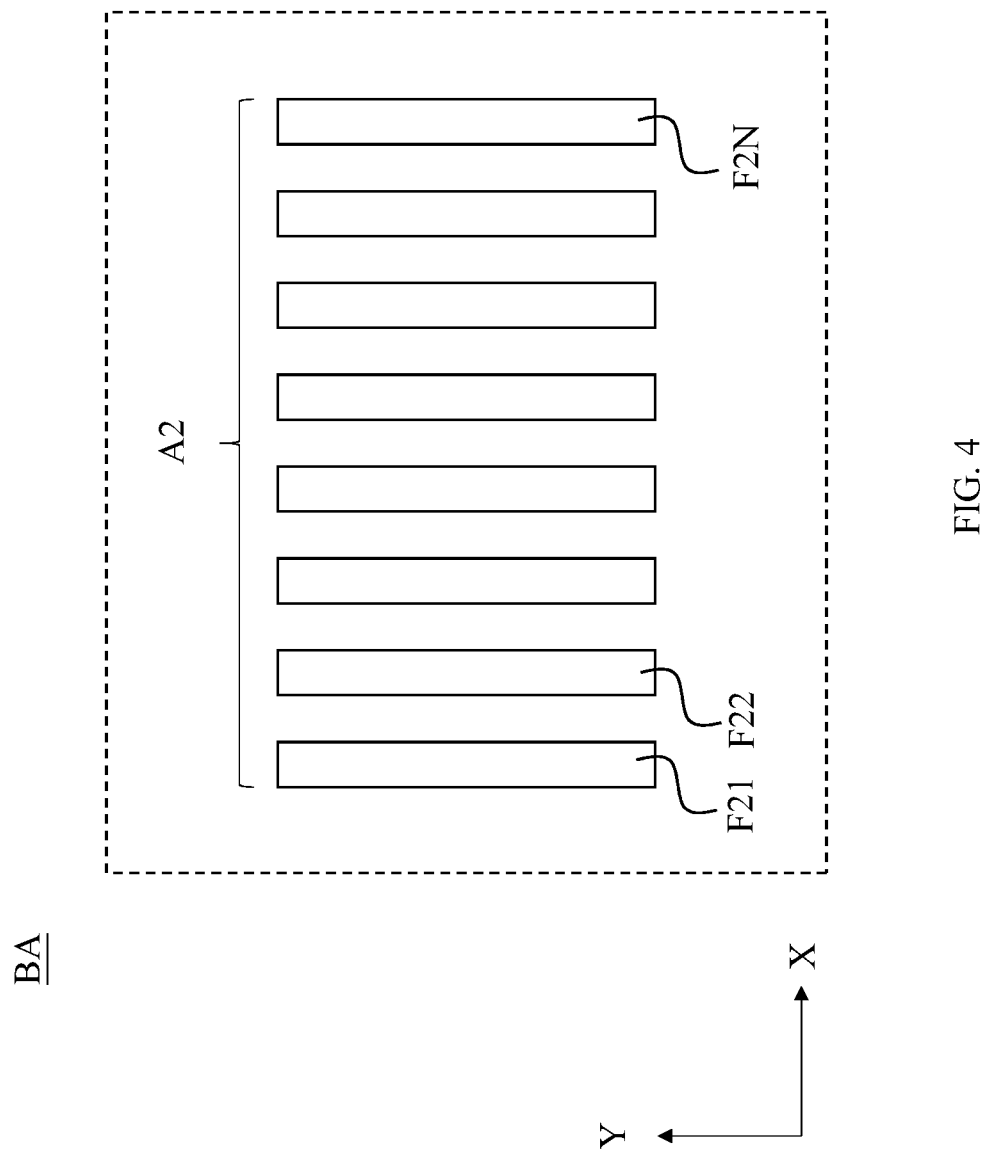
FIG. 4 is a schematic view of the bank from a top view of the wafer according to some embodiments of the present disclosure.
Figure 5:
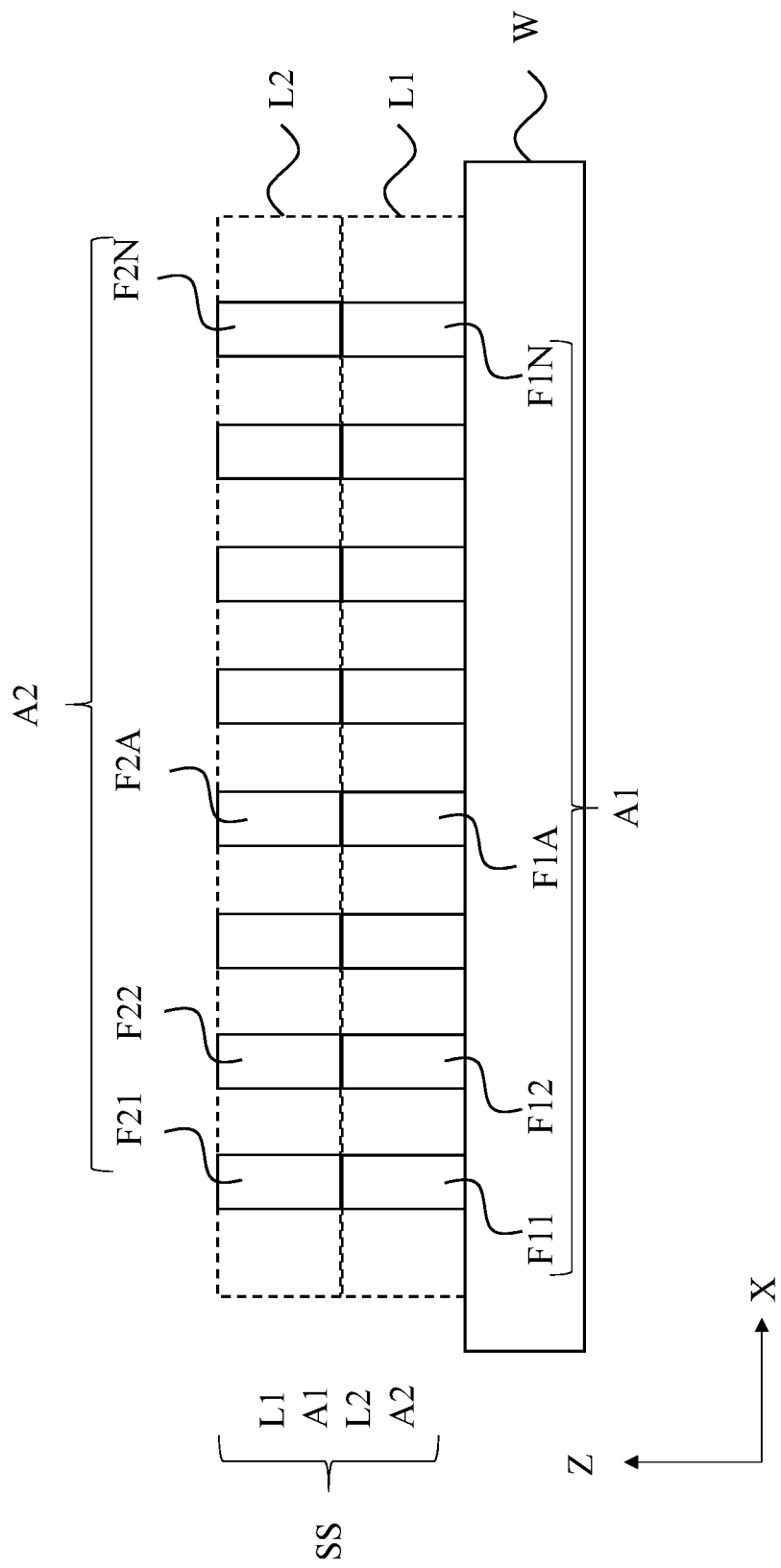
FIG. 5 is a schematic view of the bank from a cross section view of the wafer according to some embodiments of the present disclosure.

Reference is made to FIG. 4 and FIG. 5. FIG. 4 is a schematic view of the bank BA from a top view of the wafer W according to some embodiment of the present disclosure. FIG. 5 is a schematic view of the bank BA from a cross section view of the wafer W according to some embodiments of the present disclosure. In FIG. 4, the bank BA is illustrated on the X-Y plane. In FIG. 5, the bank BA is illustrated on the X-Z plane.

As illustrated in FIG. 5, the cross section view of the wafer W shows that the semiconductor structure SS includes a first layer L1 disposed on the wafer W and a second layer L2 disposed on the first layer L1. The semiconductor structure SS further includes a first fin array A1 in the first layer L1 and a second fin array A2 in the second layer L2. The first fin array A1 includes a plurality of fins which are designated as F11, F12~F1N, and the second fin array A2 includes a plurality of fins which are designated as F21, F22~F2N. In some embodiments, the number of fins in the first fin array A1 is N, and the number of fins in the second fin array A2 is N. N is an integer. Alternatively stated, the first fin array A1 and the second array fin A2 includes the same number of fins.

In some embodiments, a first fin F11 of the first fin array A1 corresponds to a first fin F21 of the second fin array A2. Similarly, a second fin F12 to an Nth fin F1N of the first fin array A1 correspond to a second fin F22 to an Nth fin F2N of the second fin array A2, respectively. In FIG. 5, the first fin F21 of the second fin array A2 is disposed on and in contact with the first fin F11 of the first fin array A1. Similarly, the second fin F22 to the Nth fin F2N of the second fin array A2 are disposed on and in contact with the second fin F12 to the Nth fin F1N of the first fin array A1, respectively.

In some embodiments, the first fin F11 to the Nth fin F1N of the first fin array A1 are the same as the first fin F21 to the Nth fin F2N of the second fin array A2, respectively. The first fin F11 to the Nth fin F1N of the first fin array A1 are overlapped by the first fin F21 to the Nth fin F2N of the second fin array A2, respectively. Therefore, as illustrated in FIG. 4, only the second fin array A2 can be seem from the top view of the wafer W.

Figure 6:
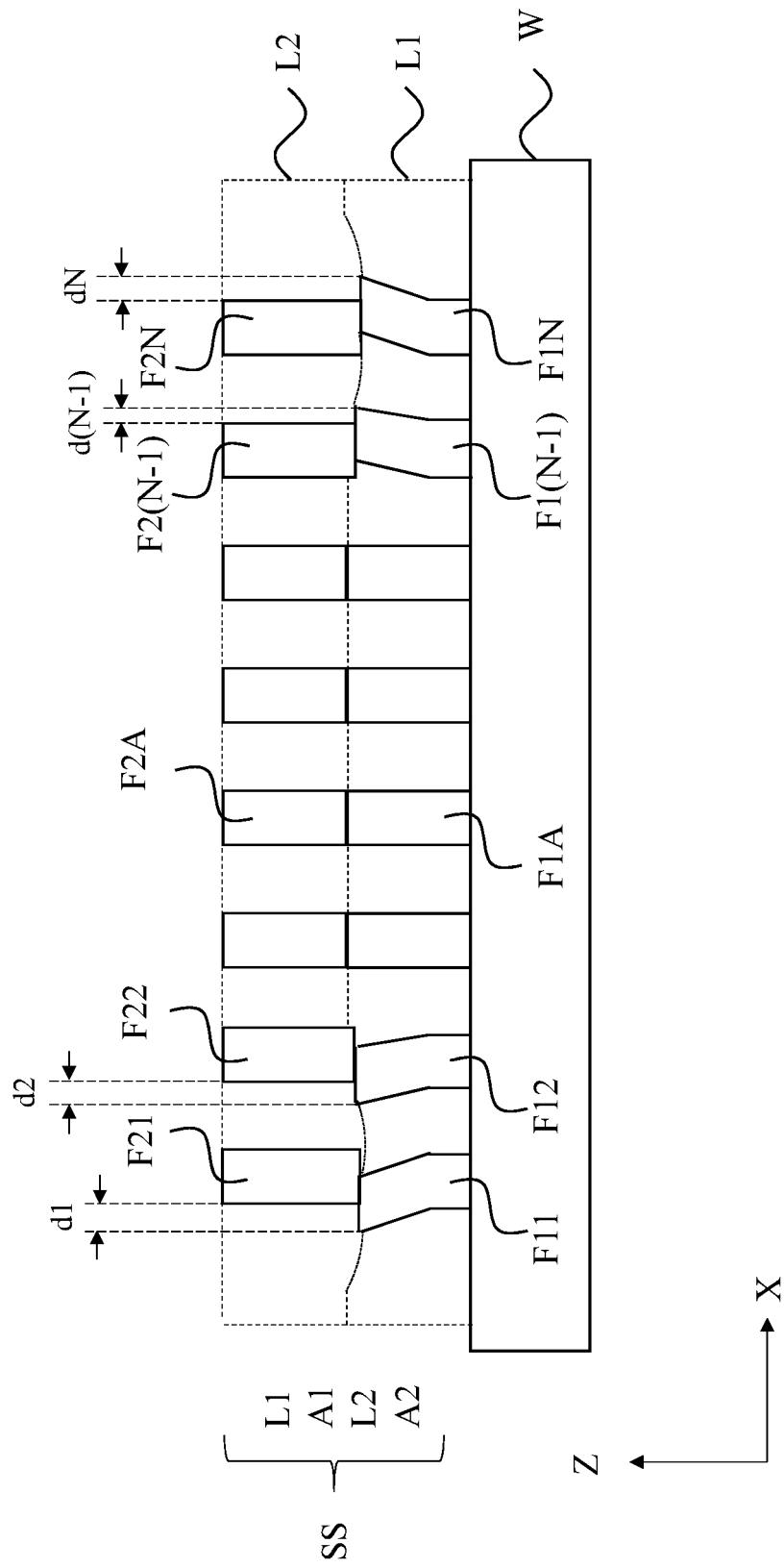
FIG. 6 is a schematic view of the bank from a cross section view of the wafer according to other embodiments of the present disclosure.
Figure 7:
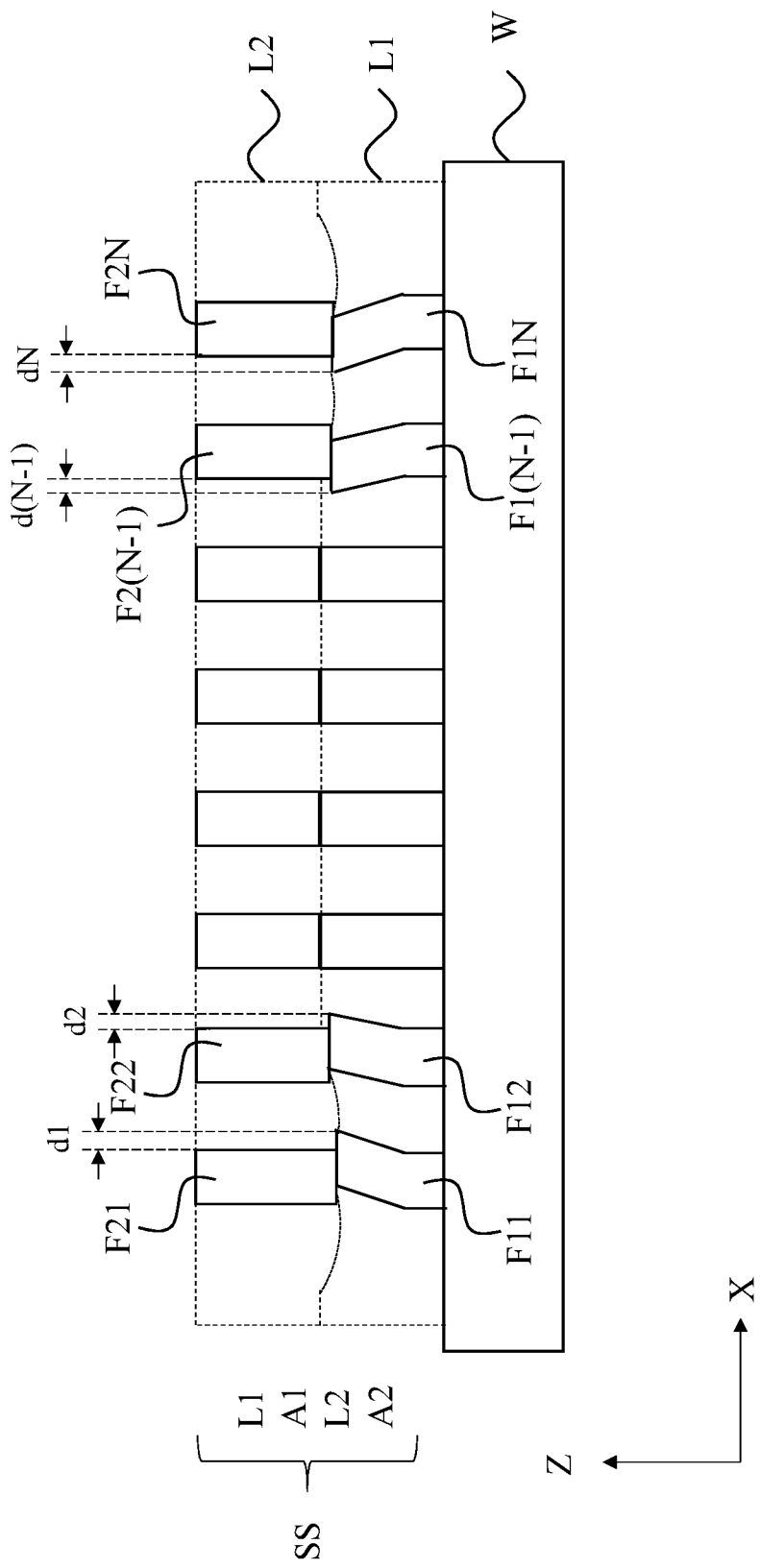
FIG. 7 is a schematic view of the bank from a cross section view of the wafer according to alternative embodiments of the present disclosure.

The first layer L1 and the second layer L2 are sequentially formed on the wafer W. In some embodiments, the first layer L1 is formed to have a flat top surface, and the second layer L2 is formed on the flat top surface of the first layer L1. However, in other embodiments, when the first fin array A1 is formed, the first layer L1 and the wafer W experience stress caused by the processes. For example, a heat treatment can cause stress at the first layer L1 as well as the first fin array A1, and the stress can deform the first fin array A1 and the first layer L1. Because the materials of the first layer L1 and the first fin array A1 are different from the wafer W. A heterojunction is formed between the first layer L1 and the wafer W. The stress causes different strains in different materials. Consequently, the first fin array A1 in the first layer L1 is deformed due to the heterojunction, and the first layer L1 is unable to have a flat top surface as shown in FIG. 6 and FIG. 7. Therefore, the second layer L2 cannot be formed on the flat top surface of the first layer L1.

Reference is made to FIG. 6. FIG. 6 is a schematic view of the bank BA in the cross section view of the wafer W according to other embodiments of the present disclosure. As illustrated in FIG. 6, the first fin array A1 in the first layer L1 is deformed. More specifically, the first fin F11, the second fin F12, the (N−1)th fin F1(N−1), and the Nth fin F1N of the first array A1 are deformed compared to the first fin array A1 shown in FIG. 5.

In some embodiments, the first fin array A1 is symmetric. The first fin F11 is symmetric to the Nth fin F1N, and the second fin F12 is symmetric to the (N−1)th fin F1(N−1). Therefore, the following description will take the first fin F11 and the second F12 as example, and the description of the (N−1)th fin F1(N−1) and the Nth fin F1N will not repeat.

The fins of the first fin array A1 are extended from the wafer W substantially along the direction of the Z-axis. Due to the deformation, the stress deforms the edge of the first fin array A1. The top portions of the first fin F11 and the second fin F12 are tilted away from the first fin array A1 (i.e., toward the direction of the negative X-axis), and the first fin F11 has more deformation than the second fin F12. As shown in FIG. 6, only the first fin F11 and the second fin F12 are illustrated being deformed, but the present disclosure is not limited hereto. In other embodiments, the stress deforms more than two fins on the edge of the first fin array A1.

The first fin F21 and the second fin F22 correspond to the first fin F11 and the second fin F12. In FIG. 6, the stress deforms the first fin F11 and the second fin F12 so as to make the top surfaces of first fin F11 and the second fin F12 are lower than other fins of the first fin array A1 in the Z-axis. Therefore, when the second layer L2 and the second fin array A2 are formed on the deformed first fin array A1, the first fin F21 and the second fin F22 extend deeper (toward the direction of the negative X-axis) than other fins of the second fin array A2. Moreover, the positions of the first fin F11 and the first fin F21 are not aligned because of the deformation. Similarly, the positions of the second fin F12 and the second fin F22 are not aligned because of the deformation. Therefore, a displacement d1, a displacement d2, a displacement d(N−1), and a displacement dN indicating the deformation are denoted in FIG. 6.

Reference is made to FIG. 7. FIG. 7 is a schematic view of the bank BA in the cross section view of the wafer W according alternative embodiments of the present disclosure. As illustrated in FIG. 7, the first fin array A1 in the first layer L1 is deformed. More specifically, the first fin F11 and the second fin F12 of the first array A1 are deformed compared to the first fin F11 and the second fin F12 shown in FIG. 5.

The fins of the first fin array A1 are extended from the wafer W substantially along the Z-axis. Due to the deformation, the stress deforms the edge of the first fin array A1. The top portions of the first fin F11 and the second fin F12 are tilted toward the first fin array A1 (i.e., toward the direction of the X-axis), and the first fin F11 has more deformation than the second fin F12. As shown in FIG. 7, only the first fin F11 and the second fin F12 are illustrated being deformed, but the present disclosure is not limited hereto. In alternative embodiments, the stress deforms more than two fins on the edge of the first fin array A1.

Similar to the embodiments in FIG. 6, in FIG. 7, the top surfaces of first fin F11 and the second fin F12 are lower than other fins of the first fin array A1 in the Z-axis. When the second layer L2 and the second fin array A2 are formed on the deformed first fin array A1, the first fin F21 and the second fin F22 extend deeper (toward the direction of the negative Z-axis) than other fins of the second fin array A2. Moreover, the positions of the first fin F11 and the first fin F21 are not aligned because of the deformation. Similarly, the positions of the second fin F12 and the second fin F22 are not aligned because of the deformation. Therefore, the displacement d1, the displacement d2, the displacement d(N−1), and the displacement dN indicating the deformation are denoted in FIG. 7.

Figure 8:
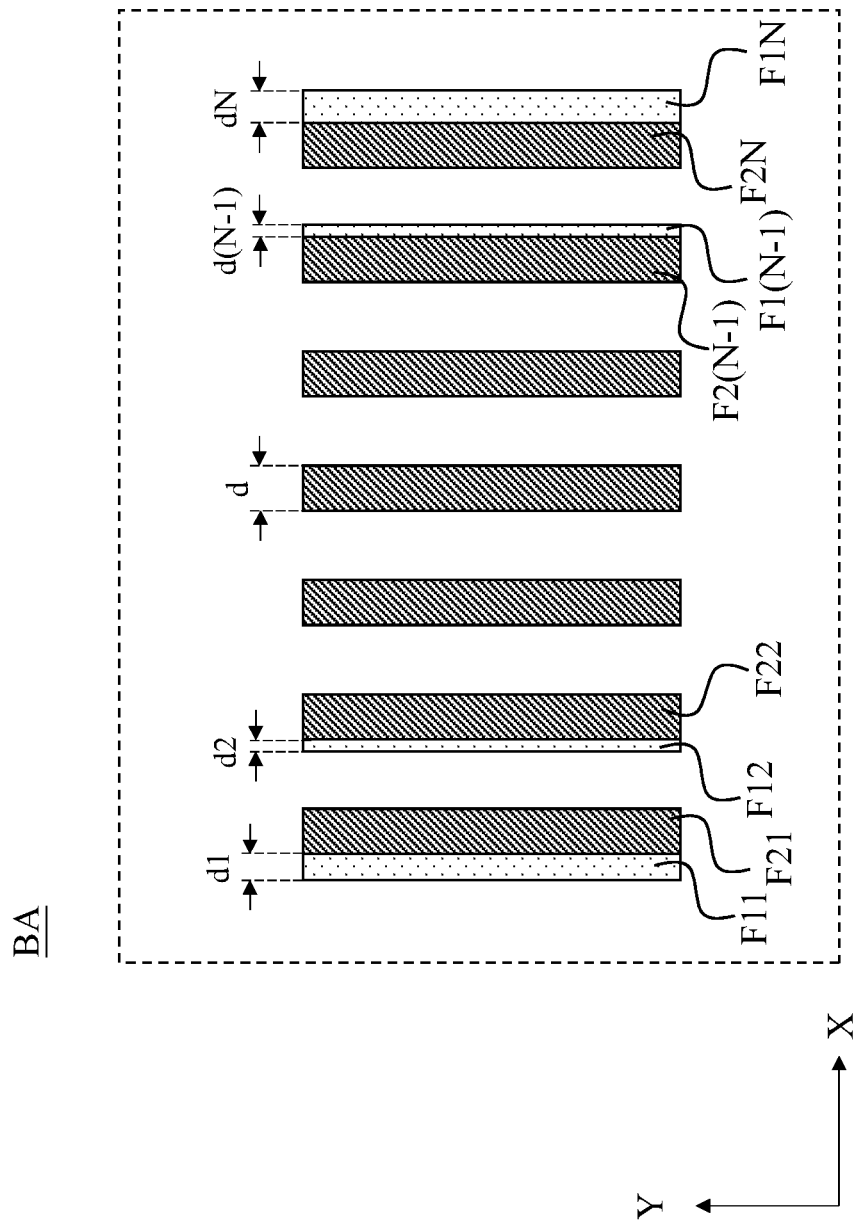
FIG. 8 is a schematic view of bank shown in FIG. 6 from a top view of the wafer according to some embodiments of the present disclosure.

Reference is made to FIG. 8. FIG. 8 is a schematic view of bank BA shown in FIG. 6 from the top view of the wafer W according to some embodiments of the present disclosure. As described in FIG. 6, the positions of the first fin F11 and the first fin F21 are not aligned, and the positions of the second fin F12 and the second fin F22 are not aligned. Compared to the bank BA shown in FIG. 4, a lateral portion of the first fin F11 and a lateral portion of the second fin F12 are not overlapped by the first fin F21 and the second fin F22, respectively. Therefore, the said lateral portions of the first fin F11 and the second fin F12 can be seem from the top view of the wafer W as shown in FIG. 8.

The displacement d1 indicates a length of the lateral portion of the first fin F11 not being overlapped by first fin F21 along the X-axis, and the displacement d2 indicates a length of the lateral portion of the second fin F12 not being overlapped by the second fin F22 along the X-axis. Similarly, the displacement dN indicates a length of the lateral portion of the Nth fin F1N not being overlapped by first fin F2N along the X-axis, and the displacement d(N−1) indicates a length of the lateral portion of the (N−1)th fin F1(N−1) not being overlapped by (N−1)th fin F2(N−1) along the X-axis. In addition, a width d indicates the width of the fins in the first array A1 and the second fin array A2. In some embodiments, the displacement d1 is greater than the displacement d2, and the displacement dN is greater than the displacement d(N−1).

In some embodiments, the displacement d1, the displacement d2, the displacement d(N−1), and the displacement dN are about several nanometers. However, in conventional approaches, the measuring equipment cannot have the measuring resolution down to the level of nanometers. Therefore, the displacements d1-dN are not able to be directly measured by the measuring device 200. Compared to the conventional approaches, the present application uses the measuring device 200 to perform the PWG measurement, the displacements d1-dN can be obtained by converting the measuring results of the PWG measurement. The details of the operations of obtaining the displacements d1-dN are described below.

The measuring device 200 is configured to measure the overlap ratio of the first fin array A1 and the second fin array A2 by performing the PWG measurement. More specifically, the measuring device 200 measures the overlap ratio R1 of the first fin F11 and the first fin F21, the overlap ratio RN of the Nth fin F1N and the Nth fin F2N, and the center overlap ratio RA of the Ath fin F1A and the Ath fin F2A. When N is an odd integer, A is equal to (N+1)/2. When N is an even integer, A is equal to N/2. The overlap ratio R1 can be presented as (d−d1)/d. Similarly, the overlap ratio RN can be presented as (d−dN)/d. In some embodiments, the Ath fin F1A is entirely overlapped by the Ath fin F2A. Therefore, the center overlap ratio RA is substantially equal to 0. In some embodiments, the overlap ratio R1 is equal to the overlap ratio RN.

After the overlap ratios R1, RN, and RA are obtained, the measuring device 200 obtains a magnification M1 associated with the displacement d1 and a magnification MN associated dN. The magnification M1 is obtained by subtracting the overlap ratio R1 from the center overlap ratio RA, and the magnification MN is obtained by subtracting the overlap ration RN from the center overlap ratio RA. In some embodiments, the magnification M1 is substantially equal to the magnification MN.

After the magnification M1 and the magnification MN are obtained, the measuring device 200 is able to obtain the displacement d1 and the displacement dN by searching correspondences associated with the magnification M1 and the magnification MN in the lookup table 210. In some embodiments, the measuring device 200 is further configured to average the magnification M1 and the magnification MN to obtain an average magnification Mavg. The measuring device 200 searches a correspondence associated with the average magnification Mavg in the lookup table 210, and further obtains an average displacement davg according to the correspondence.

The measuring device 200 determines the status of the wafer W according to the displacement d1, the displacement dN, and/or the average displacement davg. When the displacement d1, the displacement dN, and/or the average displacement davg is greater than a threshold value, the measuring device 200 determines the status of the wafer W is a fail status FAIL In this situation, the fail status FAIL indicates that the deformation of the first fin array A1 in the first layer L1 of the wafer W exceeds the manufacturing tolerance, so as to make the displacement d1, the displacement dN, and/or the average displacement davg greater than the threshold value. Therefore, the wafer W will be removed from the batch of the wafers B, and the wafer W will not be processed in the following process.

In contrast, when the displacement d1, the displacement dN and the average displacement davg are not greater than the threshold value, the measuring device 200 determines the status of the wafer W is a pass status PASS. In this situation, the pass status PASS indicates that the deformation of the first fin array A1 in the first layer L1 of the wafer W is still within the manufacturing tolerance, so that the displacement d1, the displacement dN, and the average displacement davg are not greater than the threshold value. Therefore, the wafer W will be remain in the batch of the wafers B, and the wafer W will be processed in the following process.

Compared to the embodiments shown in FIG. 4, in FIG. 6 and FIG. 8, the position of the first fin F11 in the first layer L1 is deviated from the original position toward the direction of negative X-axis, and the position of the Nth fin F1N in the first layer L1 is deviated from the original position toward the direction of the X-axis. In this embodiment, the first fin array A1 in the first layer L1 may experience a tensile stress, and the edge (i.e., the first fin F11 and the Nth fin F1N) of the first fin array A1 is extended outward from the center of the first array A1.

Figure 9:
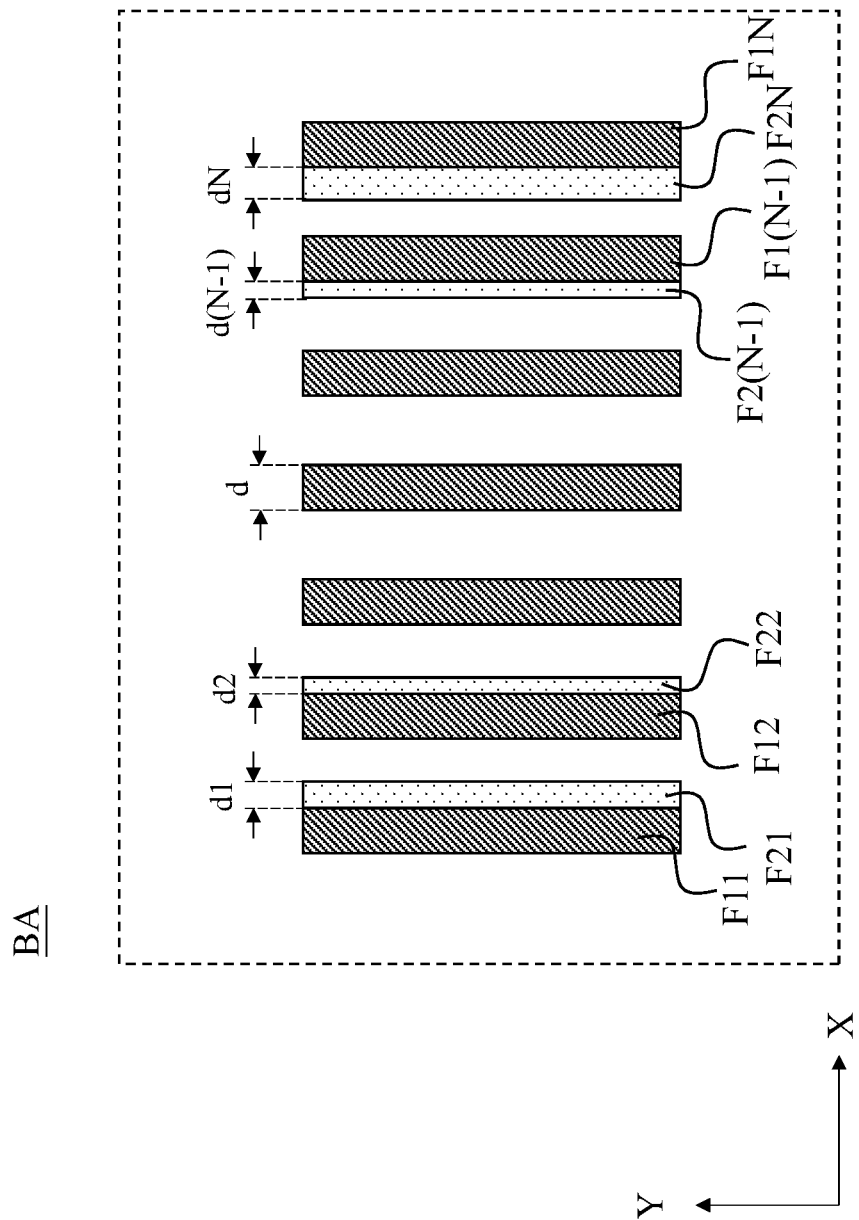
FIG. 9 is a schematic view of bank shown in FIG. 7 from a top view of the wafer according to some embodiments of the present disclosure.

Reference is made to FIG. 9. FIG. 9 is a schematic view of bank BA shown in FIG. 7 from the top view of the wafer W according to some embodiments of the present disclosure. As described in FIG. 7, the positions of the first fin F11 and the first fin F21 are not aligned, and the positions of the second fin F12 and the second fin F22 are not aligned. Compared to the bank BA shown in FIG. 4, a lateral portion of the first fin F11 and a lateral portion of the second fin F12 are not overlapped by the first fin F21 and the second fin F22, respectively. Therefore, the said lateral portions of the first fin F11 and the second fin F12 can be seem from the top view of the wafer W as shown in FIG. 9.

Similar to the embodiment shown in FIG. 8, the displacement d1 indicates the length of the lateral portion of the first fin F11 not being overlapped by first fin F21 along the X-axis, and the displacement d2 indicates the length of the lateral portion of the second fin F12 not being overlapped by the second fin F22 along the X-axis. Similarly, the displacement dN indicates the length of the lateral portion of the Nth fin F1N not being overlapped by first fin F2N along the X-axis, and the displacement d(N−1) indicates a length of the lateral portion of the (N−1)th fin F1(N−1) not being overlapped by (N−1)th fin F2(N−1) along the X-axis. In addition, a width d indicates the width of the fins in the first array A1 and the second fin array A2. In some embodiments, the displacement d1 is greater than the displacement D2, and the displacement dN is greater than the displacement d(N−1).

In some embodiments, the displacement d1, the displacement d2, the displacement d(N−1), and the displacement dN are about several nanometers.

Compared to the embodiments shown in FIG. 4, in FIG. 7 and FIG. 9, the position of the first fin F11 in the first layer L1 is deviated from the original position toward the direction of the X-axis, and the position of the Nth fin F1N in the first layer L1 is deviated from the original position toward the direction of the negative X-axis. In this embodiment, the first fin array A1 in the first layer L1 may experience a compressive stress, and the edge (i.e., the first fin F11 and the Nth fin F1N) of the first fin array A1 is compressed inward to the center the first fin array A1.

The measuring device 200 is configured to measure the overlap ratios R1, RN, and RA of the first fin array A1 and the second fin array A2 by performing the PWG measurement. The measuring device 200 is further configured to obtain the magnifications M1, MN and/or the average magnification Mavg according to the overlap ratios R1, RN, and RA, so as to obtain the displacement d1, the displacement dN, and/or the average displacement davg associated the magnifications M1, MN, and Mavg according to the lookup table 210. The above operations are is similar to the operations described in the embodiments of FIG. 6 and FIG. 8. Therefore, the details of the operations to obtain the displacement d1, the displacement dN, and the average displacement davg will not be repeat herein.

Figure 10:
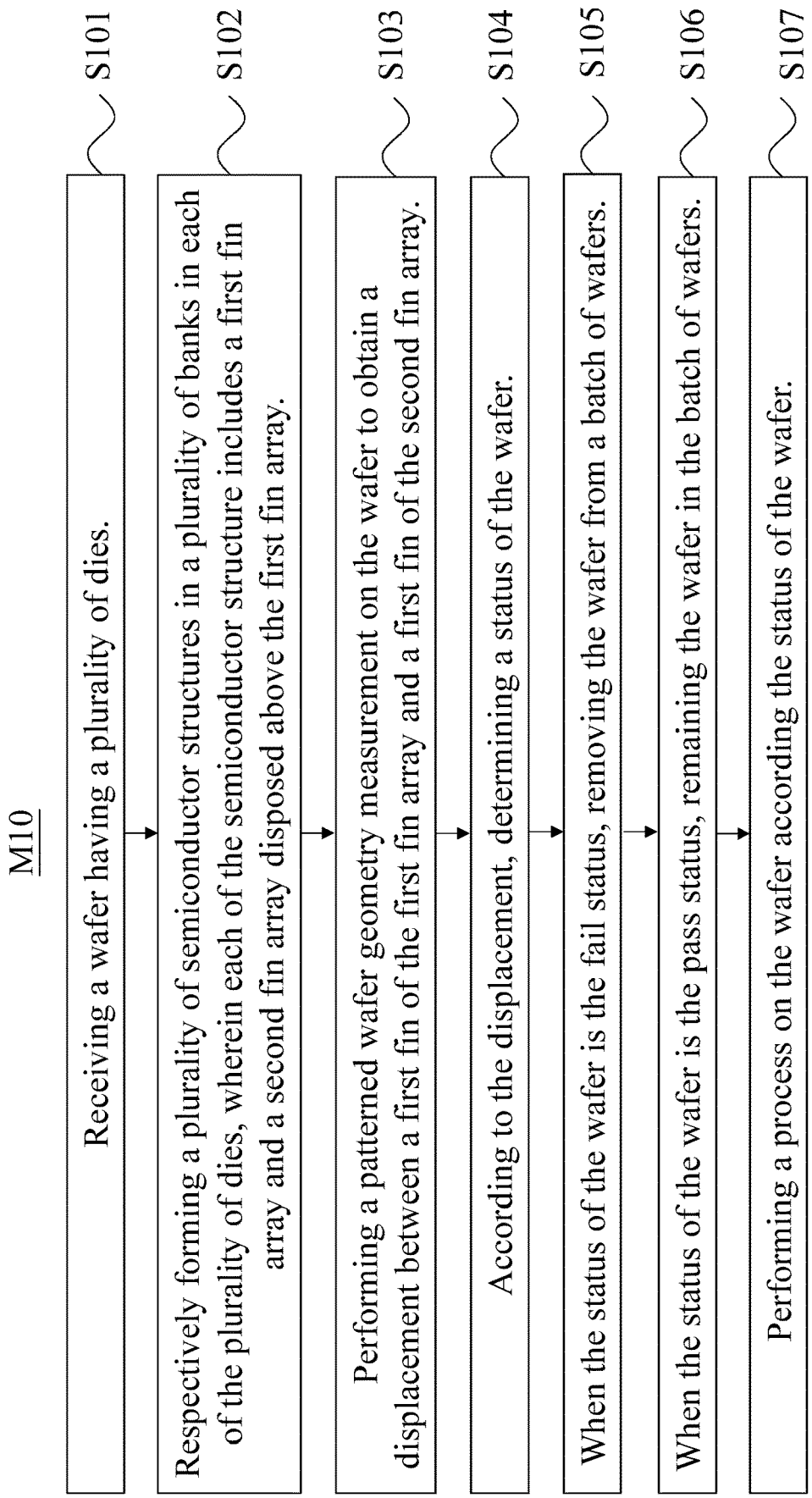
FIG. 10 is a flowchart of a method for manufacturing the semiconductor structure on the wafer and performing the PWG measurement according to some embodiments of the present disclosure.

Reference is made to FIG. 10. FIG. 10 is a flowchart of a method M10 for manufacturing the semiconductor structure SS on the wafer W and performing the PWG measurement according to some embodiments of the present disclosure. The method M10 includes operations S101, S102, S103, S104, S105, S106, and S107.

In operation S101, the wafer W having the plurality of dies D is received. In operation S102, the plurality of semiconductor structures SS are formed in each of the plurality of dies D. Each semiconductor structure SS includes a first fin array A1 and a second fin array A2 disposed above the first fin array A1. In operation S103, the PWG measurement is performed on the wafer W to obtain the displacement d1 between the first fin F11 of the first fin array A1 and the first fin F21 of the second fin array A2. In operation S104, the status of the wafer W is determined according to the displacement d1. In operation S105, when the status of the wafer W is the fail status FAIL, the wafer W is removed from the batch of wafers B. In operation S106, when the status of the wafer W is the pass status PASS, the wafer W is remained in the batch of the wafers B. In operation S107, the following process is performed on the wafer W having the pass status PASS in the batch of wafers B. In some embodiments, the following process is a photolithography process. In other embodiments, the following process is an etching process.

Figure 11:
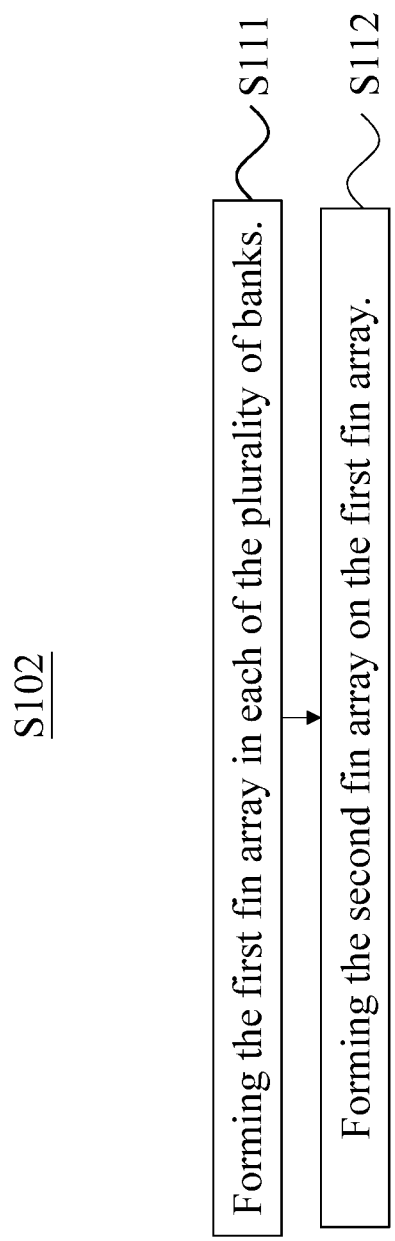
FIG. 11, FIG. 12, FIG. 13, FIG. 14, FIG. 15, and FIG. 16 are detailed flowcharts of the method shown in FIG. 10 according to some embodiments of the present disclosure.

Reference is made to FIG. 11. FIG. 11 is a flowchart of the operation S102 shown in FIG. 10 according to some embodiments of the present disclosure. The operation S102 includes operations S111 and S112.

In operation S111, the first fin array A1 is formed in each of the plurality of banks BA. In operation S112, the second fin array A2 is formed on the first fin array A2.

Figure 12:
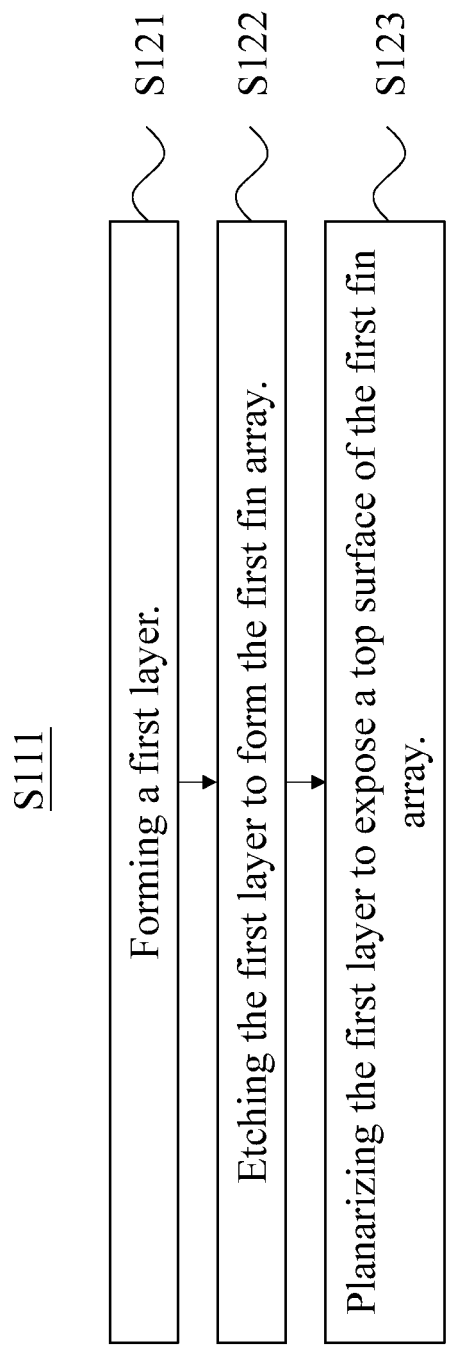
Figure 17:
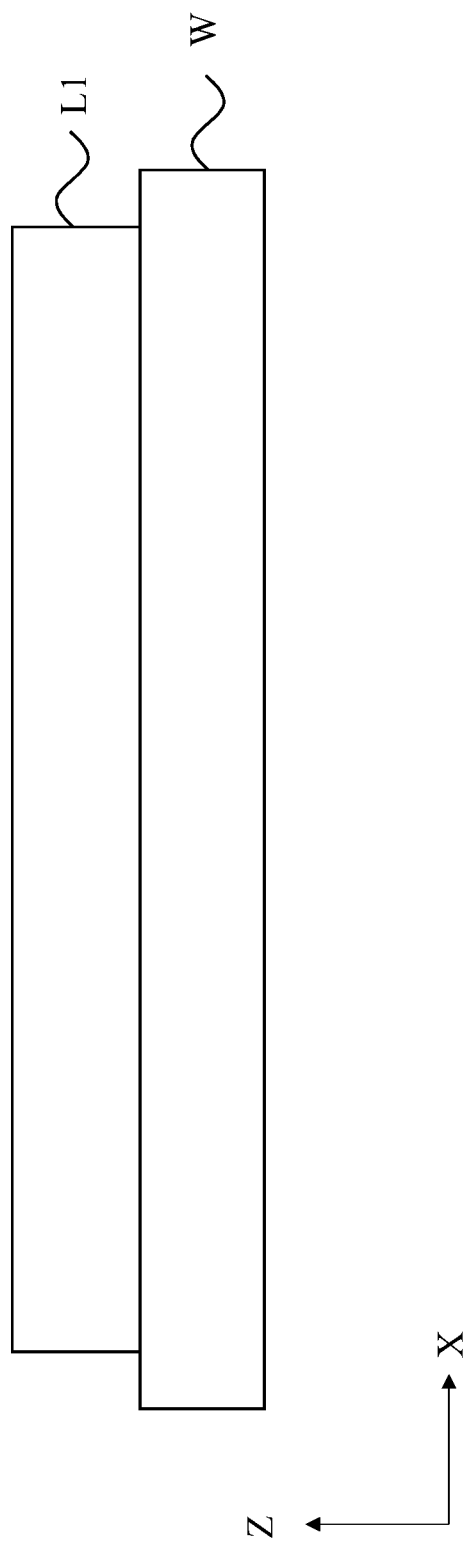
FIG. 17, FIG. 18, and FIG. 19 are schematic views of the semiconductor structure described in FIG. 12 according to some embodiments of present disclosure according to some embodiments of the present disclosure.
Figure 18:
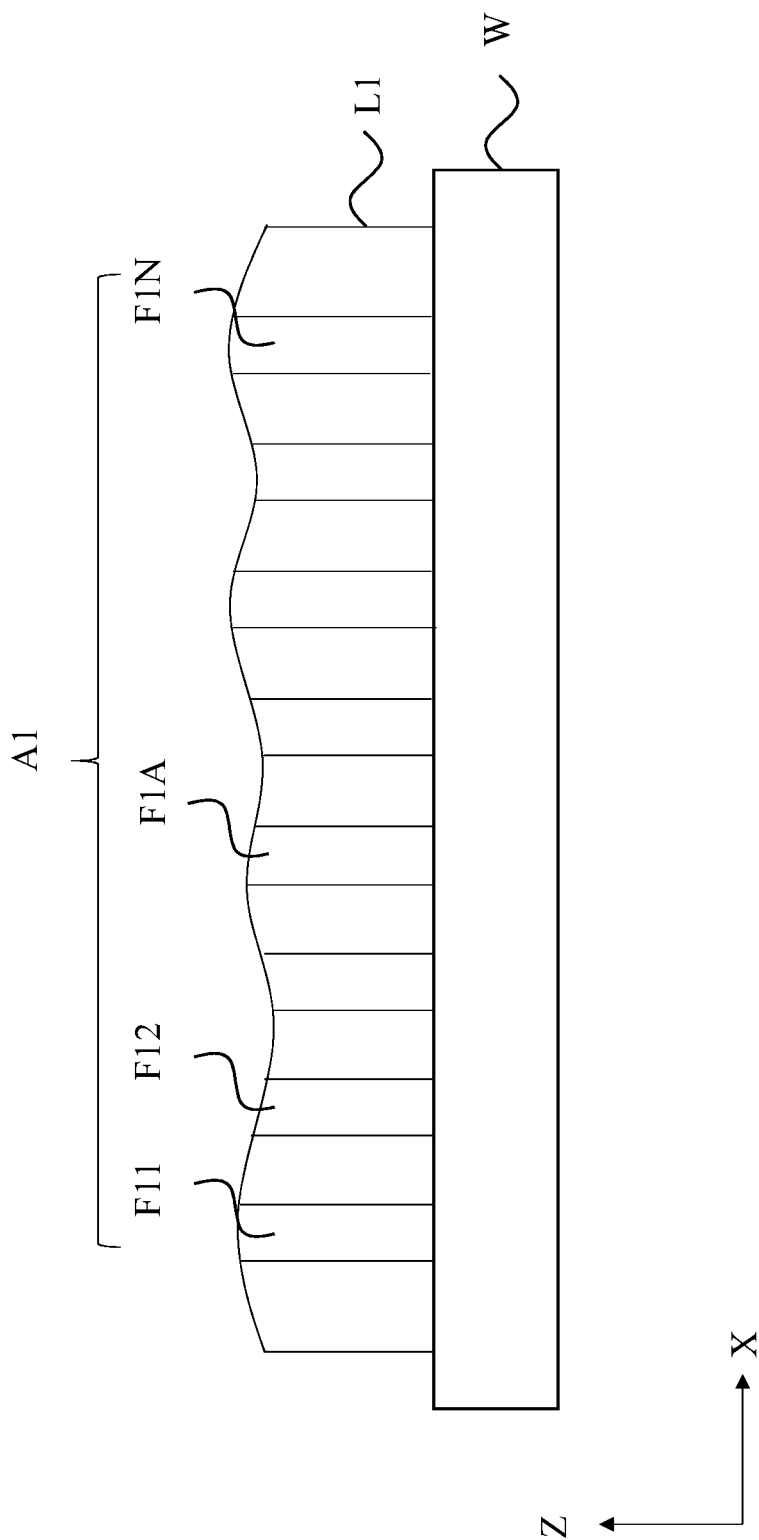
Figure 19:
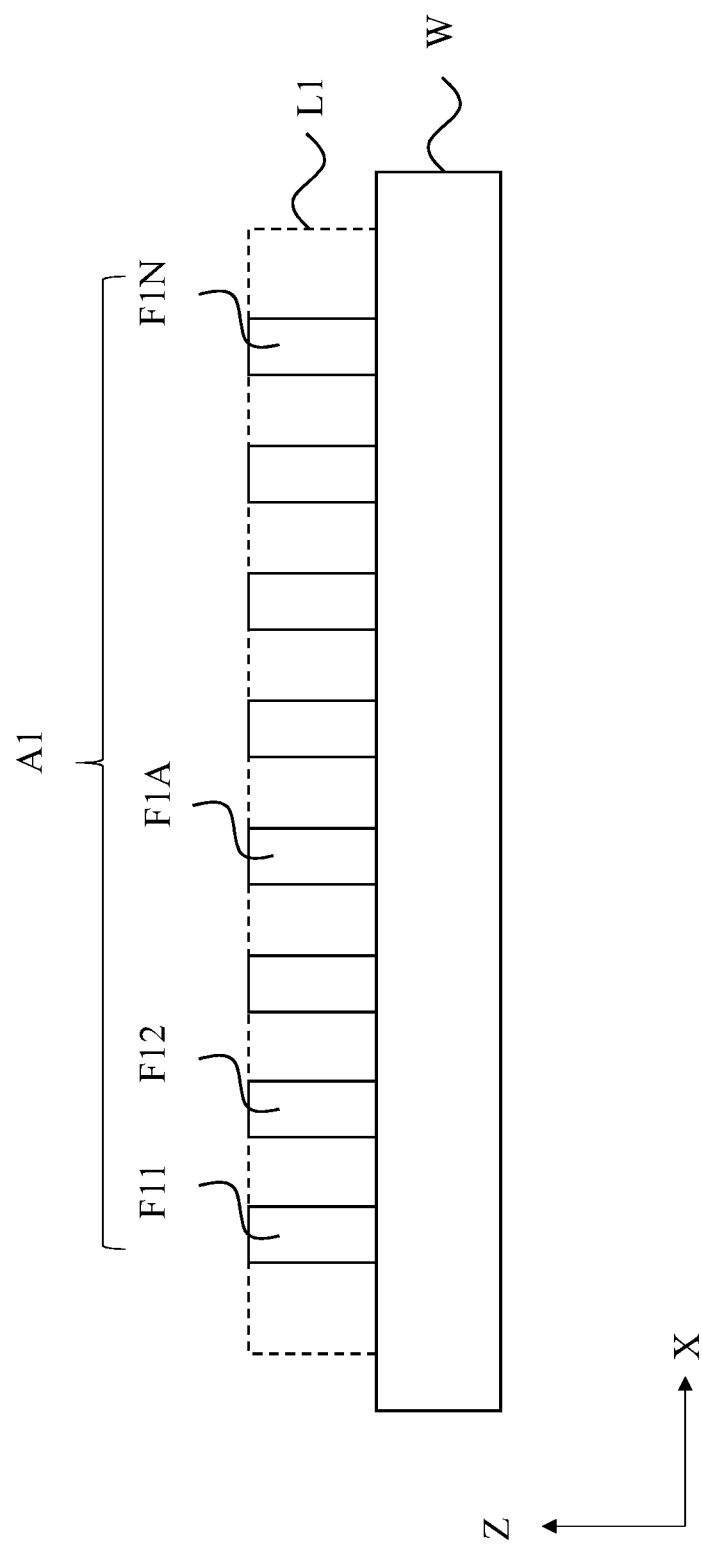

Reference is made to FIG. 12. FIG. 12 is a flowchart of the operation S111 shown in FIG. 11 according to some embodiments of the present disclosure. The operation S111 includes operations S121, S122, and S123. Please also refer to FIG. 17, FIG. 18, and FIG. 19. FIG. 17 to FIG. 19 are illustrated the formation of the semiconductor structure SS in different manufacturing steps according to some embodiments of present disclosure.

In operation S121, as shown in FIG. 17, the first layer L1 is formed on the wafer W. The first layer L1 may be deposited on the wafer W by performing chemical vapor deposition (CVD), atomic layer deposition (ALD), or other suitable depositions. In operation S122, as shown in FIG. 18, the first layer L1 is etched to form the first fin array A1. In some embodiments, the first fin array A1 is formed by depositing the material of the first fin array A1 into the etched vacancies in the first layer L1. In operation S123, as shown in FIG. 19, the first layer L1 is planarized to expose the top surface of the first fin array A1.

Figure 13:
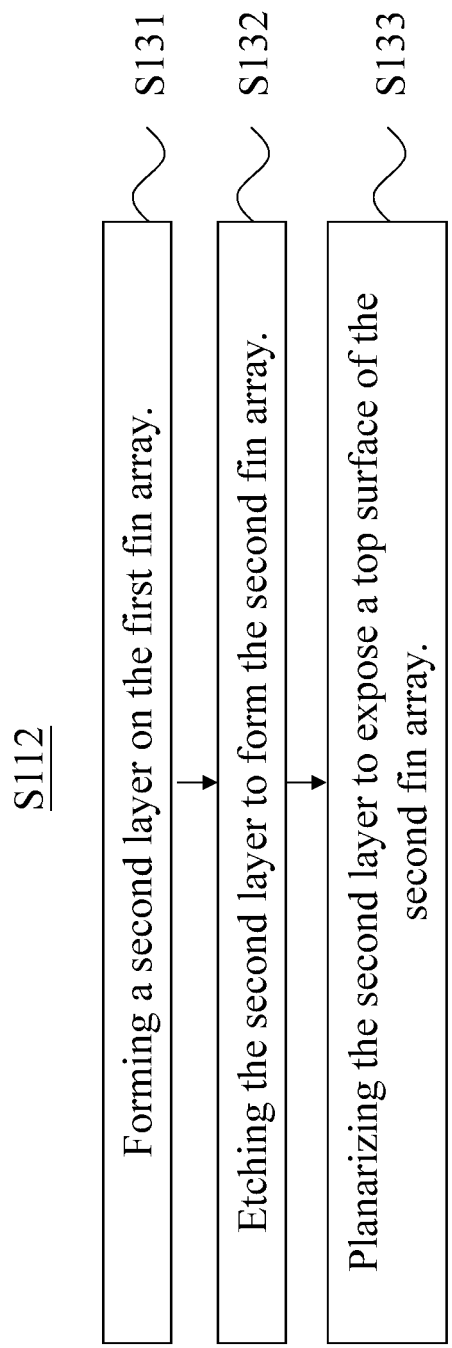
Figure 20:
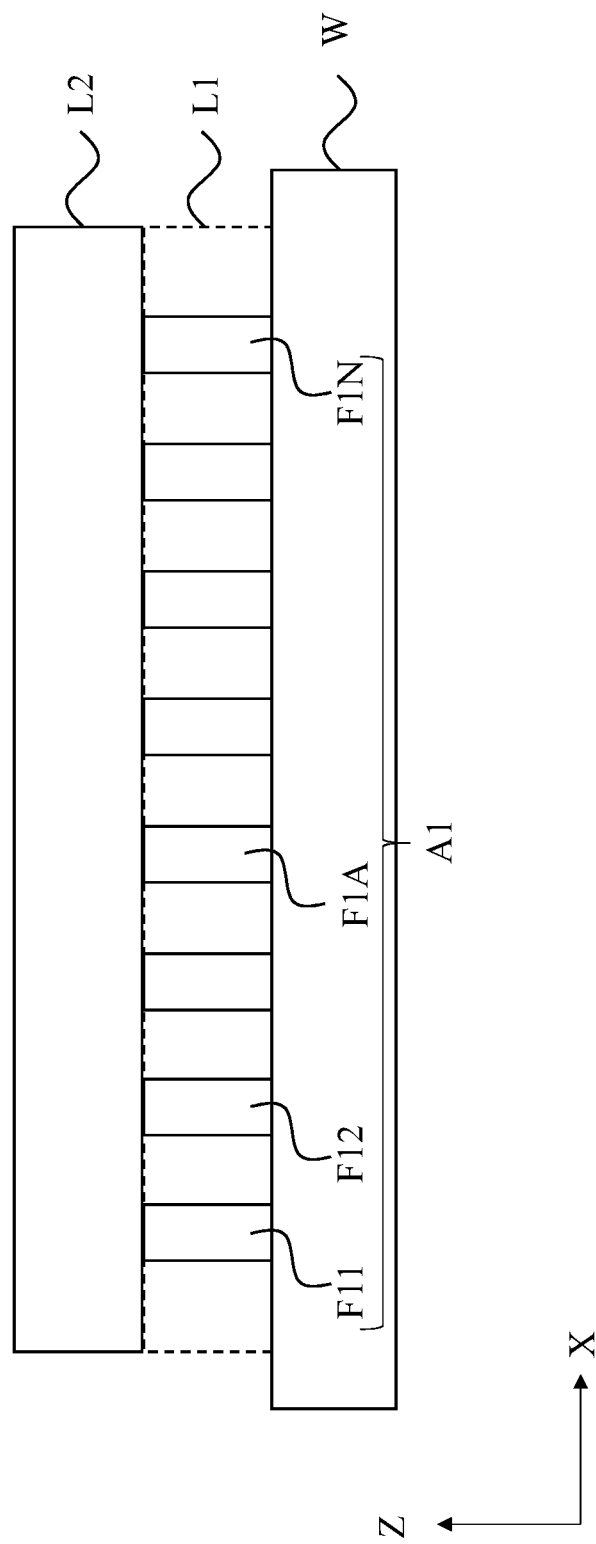
FIG. 20 and FIG. 21 are schematic views of the semiconductor structure described in FIG. 13 according to some embodiments of present disclosure according to some embodiments of the present disclosure.
Figure 21:
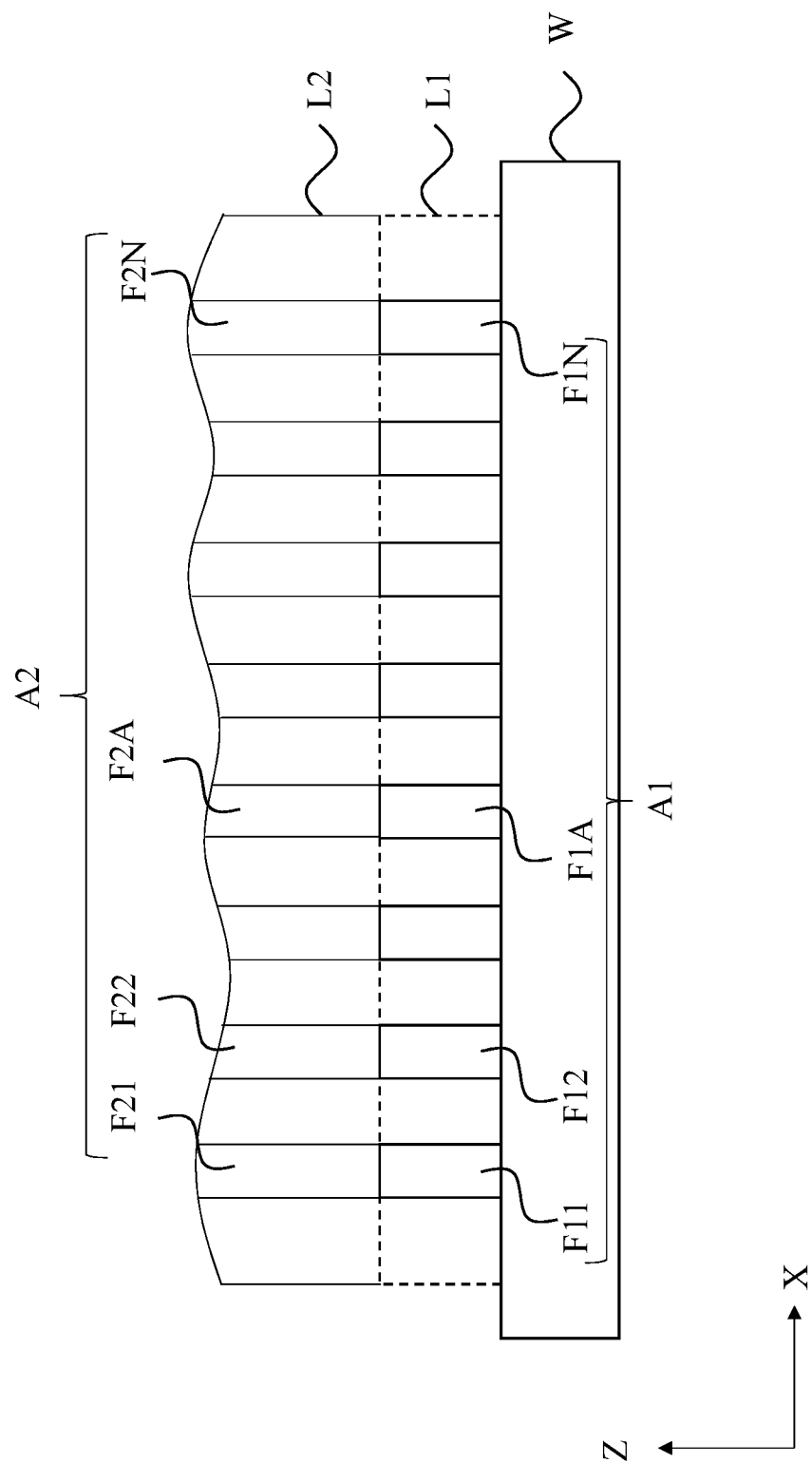

Reference is made to FIG. 13. FIG. 13 is a flowchart of the operation S112 shown in FIG. 11 according to some embodiments of the present disclosure. The operation S112 includes operations S131, S132, and S133. Please also refer to FIG. 20, FIG. 21, and FIG. 5. FIG. 20 and FIG. 21 are illustrated the formation of the semiconductor structure SS in different manufacturing steps according to some embodiments of present disclosure.

In operation S131, as shown in FIG. 20, the second layer L2 is formed on the first fin array A1. The second layer L2 may be deposited on the wafer W by performing chemical vapor deposition (CVD), atomic layer deposition (ALD), or other suitable depositions. In operation S132, as shown in FIG. 21, the second layer L2 is etched to form the second fin array A2. In some embodiments, the second fin array A2 is formed by depositing the material of the second fin array A2 into the etched vacancies in the second layer L2. In operation S133, as shown in FIG. 5, the second layer L2 is planarized to expose the top surface of the second fin array A2.

Figure 14:
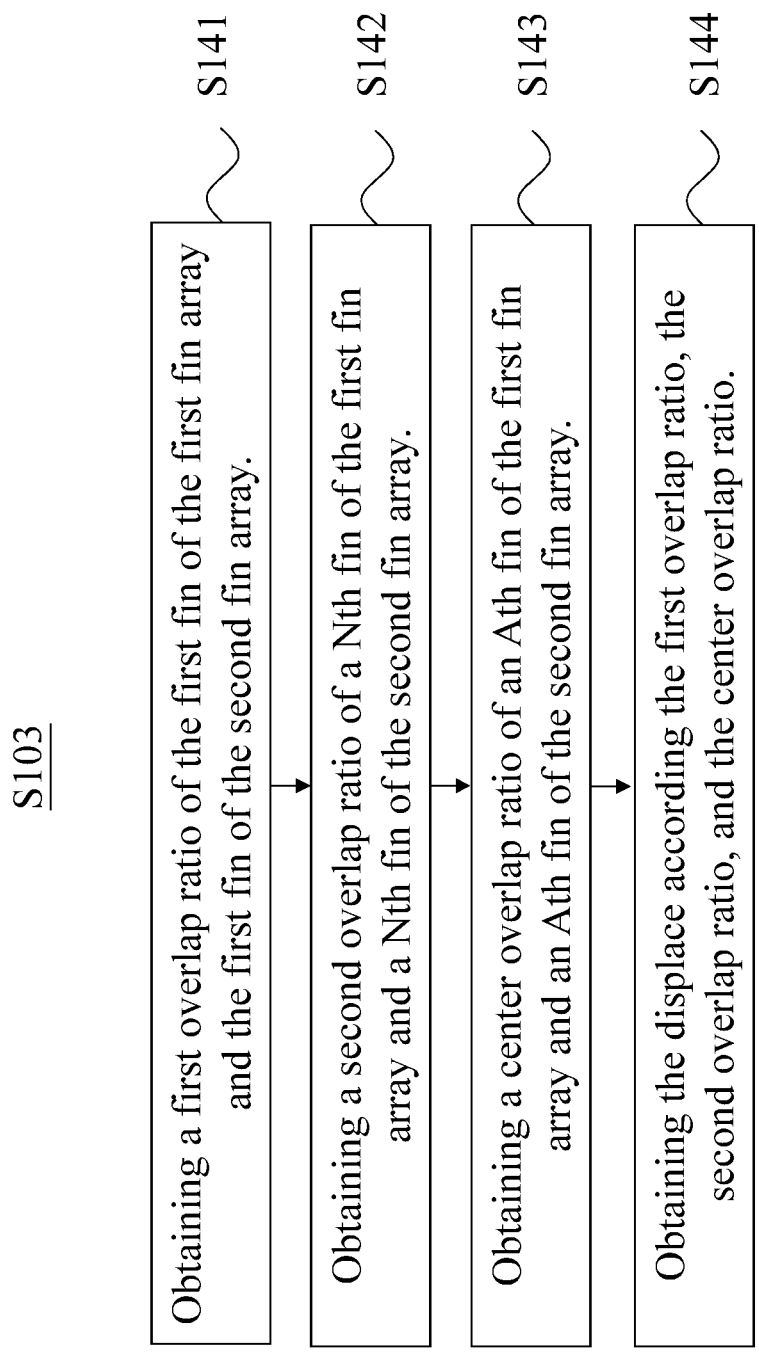

Reference is made to FIG. 14. FIG. 14 is a flowchart of the operation S103 shown in FIG. 11 according to some embodiments of the present disclosure. The operation S103 includes operations S141, S142, S143, and S144.

In operation S141, the overlap ratio R1 of the first fin F11 of the first fin array A1 and the first fin F21 of the second fin array A2 is obtained. In operation S142, the overlap ratio RN of the Nth fin F1N of the first fin array A1 and the Nth fin F2N of the second fin array A2 is obtained. In operation S143, the center overlap ratio RA of the fin F1A of the first fin array A1 and the fin F2A of the second fin array A2 is obtained. In operation S144, the displacement d1 is obtained according to the overlap ratios R1, RN, and RA.

Figure 15:
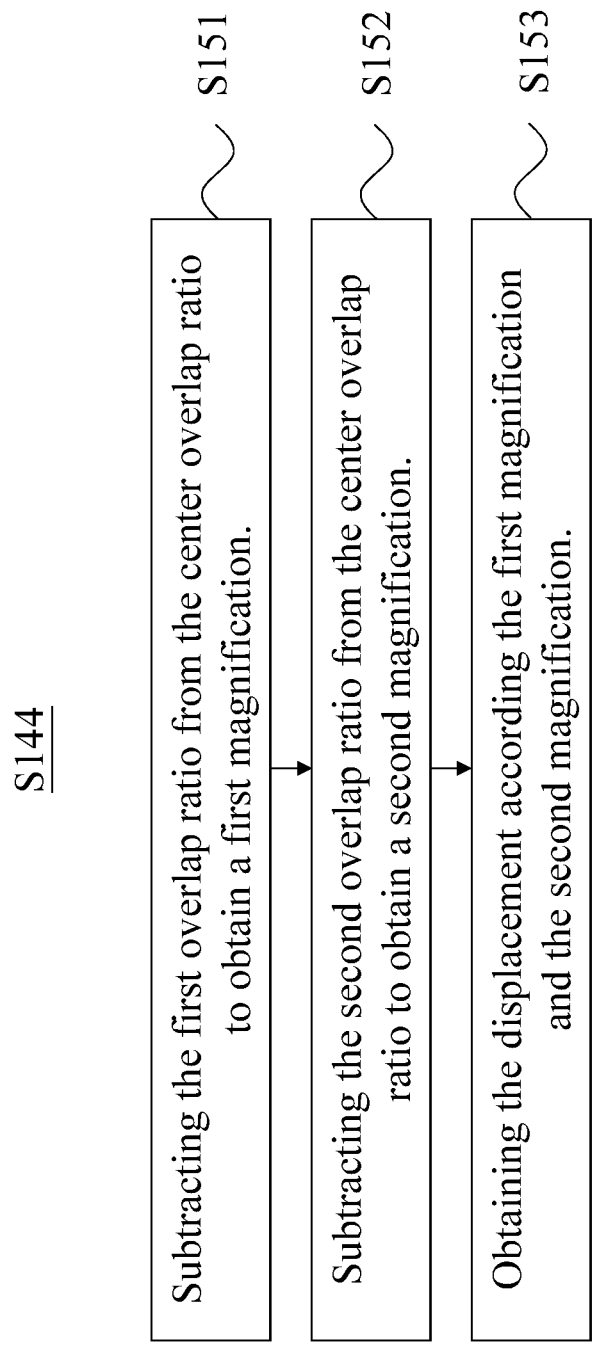

Reference is made to FIG. 15. FIG. 15 is a flowchart of the operation S144 shown in FIG. 14 according to some embodiments of the present disclosure. The operation S144 includes operations S151, S152, and S153.

In operation S151, the magnification M1 is obtained by subtracting the overlap ratio R1 from the center overlap ratio RA. In operation S152, the magnification MN is obtained by subtracting the overlap ratio RN from the center overlap ratio RA. In some embodiments, the displacement d1 is obtained according to the magnifications M1 and MN.

Figure 16:
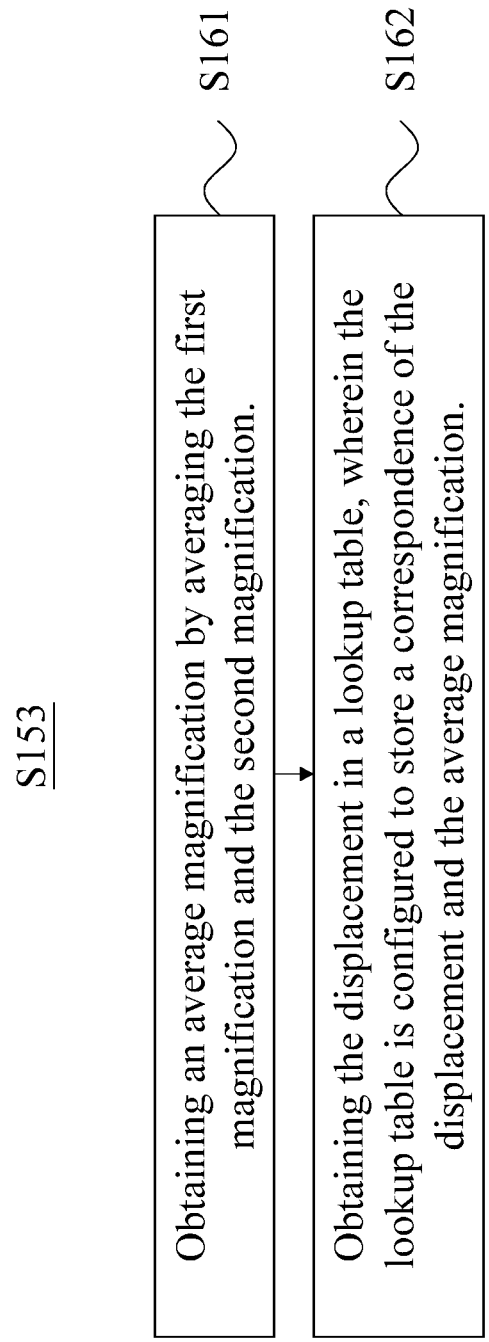

Reference is made to FIG. 16. FIG. 16 is a flowchart of the operation S153 shown in FIG. 15 according to some embodiments of the present disclosure. The operation S153 includes operations S161 and S162.

In operation S161, the average magnification Mavg is obtained by averaging the magnification M1 and the magnification MN. In operation S162, the displacement d1 and/or the displacement davg is obtained from the lookup table 210.

In some embodiments, the operation S161 is omitted from method M10. The displacement davg is obtained by using the magnification M1 to search the correspondence in the lookup table. In some embodiments, the magnification M1 is substantially equal to the average magnification Mavg, and the displacement d1 is substantially equal to the average displacement davg.

One aspect of the present disclosure provides a method for manufacturing and measuring a plurality of semiconductor structures. The method includes the following operations: receiving a wafer having a plurality of dies; respectively forming the plurality of semiconductor structures in a plurality of banks in each of the plurality of dies, wherein each of the semiconductor structure includes a first fin array and a second fin array disposed above the first fin array; performing a PWG measurement on the wafer to obtain a displacement between a first fin of the first fin array and a first fin of the second fin array; and according to the displacement, determining a status of the wafer.

Another aspect of the present disclosure provides a system for manufacturing and measuring. The system includes a process chamber and a measuring device. The process chamber is configured to: forming a first fin array in a bank of a die of a wafer; and forming a second fin array on the first fin array. The measuring device is configured to perform a PWG measuring on the wafer to obtain a displacement between a first fin of the first fin array and a first fin of the second fin array, and further configured to determine a status of wafer according to the displacement.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A system for manufacturing and measuring semiconductor structure, comprising:
 a process chamber; and
 a measuring device,
 wherein the process chamber is configured to perform operations including:

forming a first fin array in a bank of a die of a wafer, wherein the first fin array has a plurality of fins including a first fin to a Nth fin spaced apart from each other, wherein N is a positive integer; and forming a second fin array on the first fin array, wherein the second fin array has a plurality of fins including a first fin to a Nth fin spaced apart from each other, wherein the fins of the first fin array are aligned with the fins of the second fin array respectively when the second fin array overlaps on the first fin array, wherein when top portions of the first fin and the Nth fin of the first fin array are tilted away therefrom, the measuring device is configured to perform a pattern wafer geometer (PWG) measuring on the wafer to obtain a displacement between the first fin of the first fin array and the first fin of the second fin array by the PWG in nanometer level, to obtain a displacement between the Nth fin of the first fin array and the Nth fin of the second fin array by the PWG in nanometer level, and further configured to determine a status of wafer according to the displacement.

2. The system of claim 1, wherein the displacement is defined from a top view of the wafer and is determined to a misalignment between the top portion of the first fin of the first fin array and the first fin of the second fin array.

3. The system of claim 1, wherein N is a positive integer, wherein the measuring device is further configured to:

measure a first overlap ratio of the first fin of the first fin array and the first fin of the second fin array, measure a second overlap ratio of the Nth fin of the first fin array and the Nth fin of the second fin array, and measure a center overlap ratio of an Ath fin of the first fin array and an Ath fin of the second fin array, wherein the center overlap ratio is zero, such that a top portion of the Ath fin of the first fin array is aligned with the Ath fin of the second fin array;

wherein when N is an odd number, A is equal to (N+1)/2, and when N is an even number, A is equal to N/2.

4. The system of claim 3, wherein the measuring device is further configured to:

obtain a first magnification by subtracting the first overlap ratio from the center overlap ratio, obtain a second magnification by subtracting the second overlap ratio from the center overlap ratio, and obtain the displacement according the first magnification and the second magnification.

5. The system of claim 4, wherein the measuring device is further configured to:

obtain an average magnification by averaging the first magnification and the second magnification, wherein the measuring device comprises a lookup table configured to store a correspondence of the displacement and the average magnification, the measuring device is further configured to obtain the displacement according the lookup table.

6. The system of claim 1, wherein when the displacement is greater than a threshold value, the status of the wafer is determined as a fail status, and when the displacement is not greater than the threshold value, the status of the wafer is determined as a pass status.

7. The system of claim 6, wherein when the status of the wafer is the fail status, the process chamber is configured to remove the wafer from a batch of wafers.

8. The system of claim 6, wherein when the status of the wafer is the pass status, the process chamber is configured to remain the wafer in a batch of wafers.

9. The system of claim 1, wherein the top portions of the first fin and the Nth fin of the first fin array are outwardly deformed from a center of the first fin array.

10. The system of claim 1, wherein the top portions of the first fin and the Nth fin of the first fin array are inwardly deformed from a center of the first fin array.

11. The system of claim 1, wherein the measuring device is configured to measure on the wafer to obtain a second displacement between a top portion of a second fin of the first fin array and a second fin of the second fin array by the PWG, wherein the second displacement is smaller than the displacement between the top portion of the first fin of the first fin array and the first fin of the second fin array.

12. The system of claim 3, wherein the first overlap ratio is equal to the second overlap ratio.

13. The system of claim 4, wherein the first magnification is equal to the second magnification.

* * * * *